(12) United States Patent
Choi

(10) Patent No.: US 11,144,248 B2
(45) Date of Patent: Oct. 12, 2021

(54) MEMORY DEVICE AND METHOD OF OPERATING THE SAME

(71) Applicant: SK hynix Inc., Icheon-si (KR)

(72) Inventor: Hyung Jin Choi, Ulsan (KR)

(73) Assignee: SK hynix Inc., Icheon-si (KR)

( * ) Notice: Subject to any disclaimer, the term of this patent is extended or adjusted under 35 U.S.C. 154(b) by 18 days.

(21) Appl. No.: 16/730,244

(22) Filed: Dec. 30, 2019

(65) Prior Publication Data

US 2020/0387329 A1 Dec. 10, 2020

(30) Foreign Application Priority Data

Jun. 4, 2019 (KR) .......................... 10-2019-0066079

(51) Int. Cl.
*G06F 16/00* (2019.01)
*G06F 3/06* (2006.01)
*G11C 16/10* (2006.01)
*G11C 16/34* (2006.01)
*G11C 16/26* (2006.01)
*G11C 16/04* (2006.01)
*G11C 11/56* (2006.01)

(52) U.S. Cl.
CPC .......... *G06F 3/0659* (2013.01); *G06F 3/0619* (2013.01); *G06F 3/0656* (2013.01); *G06F 3/0679* (2013.01); *G11C 16/0483* (2013.01); *G11C 16/10* (2013.01); *G11C 16/26* (2013.01); *G11C 16/3459* (2013.01); *G11C 11/5621* (2013.01); *G11C 11/5671* (2013.01)

(58) Field of Classification Search
CPC ..... G11C 16/10; G11C 16/26; G11C 16/3459; G11C 11/5621; G11C 11/5671
See application file for complete search history.

(56) References Cited

U.S. PATENT DOCUMENTS

| 7,180,784 B2 * | 2/2007 | Ju ...................... G11C 16/3436 |
| | | 365/185.12 |
| 8,792,285 B2 * | 7/2014 | Hung ................. G11C 16/0483 |
| | | 365/189.05 |
| 10,614,863 B2 * | 4/2020 | Kim ..................... G11C 7/1057 |
| 2017/0242586 A1 * | 8/2017 | Jung ................... G11C 11/5635 |

FOREIGN PATENT DOCUMENTS

| KR | 101106977 B1 | 1/2012 |
| KR | 1020160131268 A | 11/2016 |

* cited by examiner

*Primary Examiner* — Pho M Luu
(74) *Attorney, Agent, or Firm* — William Park & Associates Ltd.

(57) ABSTRACT

Provided herein may be a memory device and a method of operating the same. The memory device may include memory cells for storing data, page buffers coupled to the memory cells, the page buffers including first latches for temporarily storing original data during a program operation and second latches for storing verification data during a verify operation, and a command execution component for controlling the page buffers, in response to a normal command signal, a suspend command signal, or a resume command signal, to store the original data and the verification data in the first and second latches in response to the normal command signal, to provide the verification data to the first latches in response to the suspend command signal, and to transfer the verification data from the first latches to the second latches in response to the resume command signal.

15 Claims, 13 Drawing Sheets

FIG. 17

[NCMD]

|  | ER | PV1 | PV2 | PV3 | PV4 | PV5 | PV6 | PV7 |
|---|---|---|---|---|---|---|---|---|
| Q1_N (MSB) | 0 | 1 | 1 | 1 | 1 | 0 | 0 | 0 |
| Q2_N (CSM) | 0 | 0 | 1 | 1 | 0 | 0 | 1 | 1 |
| Q3_N (LSB) | 0 | 0 | 0 | 1 | 1 | 1 | 1 | 0 |

FIG. 18

[NCMD]

|  | ER | PV1 | PV2 | PV3 | PV4 | PV5 | PV6 | PV7 |
|---|---|---|---|---|---|---|---|---|
| Q4_N | 0 | 1/0 | 1/0 | 1/0 | 1/0 | 1/0 | 1/0 | 1/0 | fail/pass

FIG. 19

[SCMD]

|  | ER | PV1 | PV2 | PV3 | PV4 | PV5 | PV6 | PV7 |
|---|---|---|---|---|---|---|---|---|
| S0 | 1 | 0/1 | 0/1 | 0/1 | 0/1 | 0/1 | 0/1 | 0/1 | fail/pass

FIG. 20

[SCMD]

|  | ER | PV1 | PV2 | PV3 | PV4 | PV5 | PV6 | PV7 |
|---|---|---|---|---|---|---|---|---|
| Q1_N (MSB) | 0 | 1/0 | 1/0 | 1/0 | 1/0 | 0 | 0 | 0 |
| Q2_N (CSM) | 0 | 0 | 1/0 | 1/0 | 0 | 0 | 1/0 | 1/0 |
| Q3_N (LSB) | 0 | 0 | 0 | 1/0 | 1/0 | 1/0 | 1/0 | 0 | fail/pass

|  | ER | PV1 | PV2 | PV3 | PV4 | PV5 | PV6 | PV7 |
|---|---|---|---|---|---|---|---|---|
| Q4_N | 1 | 1 | 1 | 1 | 1 | 1 | 1 | 1 |

[RCMD]

[RCMD]

|  | ER | PV1 | PV2 | PV3 | PV4 | PV5 | PV6 | PV7 |
|---|---|---|---|---|---|---|---|---|
| Q1_N (MSB) | 0 | 1/0 | 1/0 | 1/0 | 1/0 | 0 | 0 | 0 |
| Q2_N (CSM) | 0 | 0 | 1/0 | 1/0 | 0 | 0 | 1/0 | 1/0 |
| Q3_N (LSB) | 0 | 0 | 0 | 1/0 | 1/0 | 1/0 | 1/0 | 0 | fail/pass

|  | ER | PV1 | PV2 | PV3 | PV4 | PV5 | PV6 | PV7 |
|---|---|---|---|---|---|---|---|---|
| S0 | 1 | 0/1 | 0/1 | 0/1 | 0/1 | 0/1 | 0/1 | 0/1 | fail/pass

FIG. 23

[RCMD]

|  | ER | PV1 | PV2 | PV3 | PV4 | PV5 | PV6 | PV7 |
|---|---|---|---|---|---|---|---|---|
| Q4_N | 1 | 0/1 | 0/1 | 0/1 | 0/1 | 0/1 | 0/1 | 0/1 | fail/pass

|  | ER | PV1 | PV2 | PV3 | PV4 | PV5 | PV6 | PV7 |
|---|---|---|---|---|---|---|---|---|
| Q1_N (MSB) | 0 | 1/0 | 1/0 | 1/0 | 1/0 | 0 | 0 | 0 |
| Q2_N (CSM) | 0 | 0 | 1/0 | 1/0 | 0 | 0 | 1/0 | 1/0 |
| Q3_N (LSB) | 0 | 0 | 0 | 1/0 | 1/0 | 1/0 | 1/0 | 0 | fail/pass

FIG. 24

[RCMD]

|  | ER | PV1 | PV2 | PV3 | PV4 | PV5 | PV6 | PV7 |
|---|---|---|---|---|---|---|---|---|
| S0 (PV1) | 0 | 1/0 | 0 | 0 | 0 | 0 | 0 | 0 |
| S0 (PV2) | 0 | 0 | 1/0 | 0 | 0 | 0 | 0 | 0 |
| S0 (PV3) | 0 | 0 | 0 | 1/0 | 0 | 0 | 0 | 0 |
| S0 (PV4) | 0 | 0 | 0 | 0 | 1/0 | 0 | 0 | 0 |
| S0 (PV5) | 0 | 0 | 0 | 0 | 0 | 1/0 | 0 | 0 |
| S0 (PV6) | 0 | 0 | 0 | 0 | 0 | 0 | 1/0 | 0 |
| S0 (PV7) | 0 | 0 | 0 | 0 | 0 | 0 | 0 | 1/0 | fail/pass

MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0066079 filed on Jun. 4, 2019, in the Korean Intellectual Property Office, the entire disclosure of which is incorporated herein by reference.

BACKGROUND

1. Technical Field

Various embodiments of the present disclosure generally relate to a memory device and a method of operating the memory device, and more particularly, to a memory device that operates in response to a suspend command and a method of operating the memory device.

2. Related Art

A memory system may include a memory device and a controller.

The memory device may include a plurality of memory cells that store data therein. The memory cells may be implemented as volatile memory cells, in which stored data is lost when the supply of power is interrupted, or may be implemented as nonvolatile memory cells, in which stored data is maintained even when the supply of power is interrupted.

The controller may control data communication between a host and the memory device. For example, the controller may control the memory device in response to a request from the host. Also, the controller may perform a background operation in order to improve the performance of the memory system even if there is no request from the host.

The host may communicate with the memory device through the controller by using an interface protocol, such as Peripheral Component Interconnect-Express (PCI-E), Advanced Technology Attachment (ATA), Serial ATA (SATA), Parallel ATA (PATA), or serial attached SCSI (SAS). The interface protocols between the host and the memory system are not limited to the above-mentioned examples, and various interfaces, such as Universal Serial Bus (USB), Multi-Media Card (MMC), Enhanced Small Disk Interface (ESDI), Integrated Drive Electronics (IDE), and the like, may be included.

SUMMARY

An embodiment of the present disclosure may provide for a memory device. The memory device may include memory cells in which data is stored, page buffers coupled to the memory cells through bit lines, the page buffers including first latches configured to temporarily store original data during a program operation and second latches configured to store verification data during a verify operation, and a command execution component configured to control the page buffers in response to a normal command signal, a suspend command signal, or a resume command signal. The command execution component may control the page buffers to store the original data in the first latches and store the verification data in the second latches in response to the normal command signal, to provide the verification data, stored in the second latches, to the first latches in response to the suspend command signal, and to transfer the verification data from the first latches to the second latches in response to the resume command signal.

An embodiment of the present disclosure may provide for a memory device. The memory device may include a page buffer, including first to third latches, in which original data is stored, during a program operation, for a selected page, and fourth and fifth latches, in which verification data, that varies during a verify operation, is stored. The page buffer may be configured to transfer the verification data stored in the fourth latch to the fifth latch when a suspend operation is started, to perform a read operation using the fourth and fifth latches after reconfiguring the original data stored in the first to third latches based on the verification data transferred to the fifth latch, to restore the verification data to the fourth latch using the data stored in the first to third latches when the read operation is finished, and to resume a normal operation, which had been suspended due to the suspend operation, using the verification data restored to the fourth latch.

An embodiment of the present disclosure may provide for a method of operating a memory device. The method may include performing a program operation by increasing a threshold voltage of memory cells using original data stored in first latches and by performing a verify operation of the memory cells using second latches, suspending the program operation when a suspend command is received during the program operation, transferring verification data, stored in the second latches, to the first latches when the program operation is suspended, performing a read operation, corresponding to the suspend command, using the second latches, restoring the verification data to the second latches using the data stored in the first latches when the read operation is completed, and resuming the suspended program operation using the restored verification data.

BRIEF DESCRIPTION OF THE DRAWINGS

FIGS. 17 to 24 are diagrams for specifically explaining a method for transferring data in the page buffer, illustrated in FIG. 14, based on an operating method according to the present disclosure.

DETAILED DESCRIPTION

Advantages and features of the present disclosure, and methods for achieving the same will be cleared with reference to exemplary embodiments described later in detail together with the accompanying drawings. The present disclosure is not limited to the following embodiments but embodied in other forms. Rather, these embodiments are provided so that the present disclosure will be thorough and complete, and will fully convey the technical spirit of the disclosure to those skilled in the art.

It is also noted that in this specification, "connected/coupled" refers to one component not only directly coupling another component but also indirectly coupling another component through an intermediate component. In the specification, when an element is referred to as "comprising" or "including" a component, it does not preclude another component but may further include other components unless the context clearly indicates otherwise.

Various embodiments of the present disclosure are directed to a memory device and a method of operating the memory device, which may easily perform a program operation, a suspend operation, and a resume operation while preventing an increase in the number of latches in such a way that latches configured to temporarily store verification data during a program verify operation are used for a suspend read operation when a suspend read command is received while a program operation is being performed.

Figure 1:
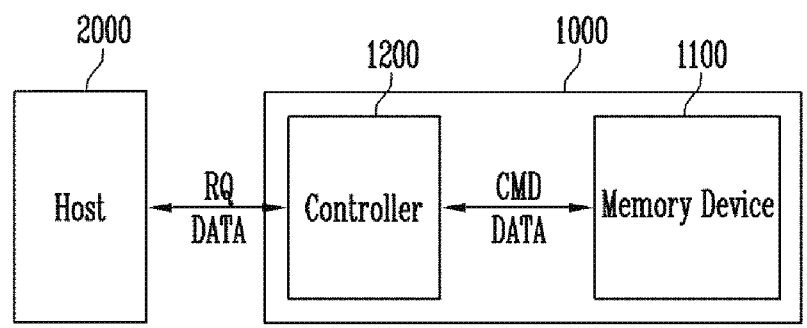
FIG. 1 a diagram, illustrating a memory system, according to an embodiment of the present disclosure.

FIG. 1 is a diagram, illustrating a memory system, according to an embodiment of the present disclosure.

Referring to FIG. 1, the memory system 1000 may include a memory device 1100, in which data is stored, a controller 1200, which communicates between the memory device 1100 and a host 2000.

The memory device 1100 may be configured with a volatile memory device, in which stored data is lost when the supply of power is interrupted, or may be configured with a nonvolatile memory device, in which stored data is maintained even if the supply of power is interrupted. In the embodiment to be described below, the memory device 1100 implemented as a nonvolatile memory device is illustrated. Here, the nonvolatile memory device may be a NAND flash memory device.

The memory device 1100 may perform various operations in response to a command CMD received from the controller 1200. For example, when a program command CMD and data DATA are received, the memory device 1100 may program the received data DATA into a selected memory block. Also, when a read command CMD is received, the memory device 1100 may read data DATA from the selected memory block and output the same to the controller 1200.

The controller 1200 may communicate between the host 2000 and the memory device 1100. The controller 1200 may control the memory device 1100 in response to a request RQ from the host 2000, or may perform a background operation to improve the performance of the memory system 1000 without any request from the host 2000.

The host 2000 may transfer various requests RQ to the memory system 1000. For example, the host 2000 may transfer a program request, a read request, an erase request, and the like, to the memory system 1000, and the controller 1200 of the memory system 1000 may control the memory device 1100 in response to the received request. The host 2000 may communicate with the memory system 1000 through various interfaces, such as Peripheral Component Interconnect Express (PCIe), Advanced Technology Attachment (ATA), Serial ATA (SATA), Parallel ATA (PATA), serial attached SCSI (SAS), Non-Volatile Memory Express (NVMe), Universal Serial Bus (USB), Multi-Media Card (MMC), Enhanced Small Disk Interface (ESDI), Integrated Drive Electronics (IDE), and the like.

In the memory system 1000 of the present embodiment, when it receives various requests RQ from the host 2000, the controller 1200 may convert the requests RQ into commands CMD in order to control the memory device 1100 and may queue the commands CMD, based on the state of the memory device 1100. Although the memory device 1100 is illustrated as a single device in the drawing, a plurality of memory devices may be included, based on the memory system 1000. With a plurality of memory devices, the controller 1200 queues the commands, based on the states of the memory devices, and transfers the commands to the memory devices in the order in which the commands are queued, whereby the performance of the memory system 1000 may be improved.

For example, when a suspend read request is received from the host 2000 in the state in which a plurality of commands are queued, the controller 1200 may preemptively execute a suspend command, corresponding to the suspend read request, before executing the queued commands. That is, when the memory device 1100 is performing a program operation, the controller 1200 may transfer the suspend command to the memory device 1100 before the other commands.

When the operation, corresponding to the suspend command, is terminated, the controller 1200 may transfer a resume command to the memory device 1100, and the memory device 1100 may resume the suspended program operation in response to the resume command.

Here, the memory device 1100 may store the current data of the suspended program operation and may resume the program operation from where the program operation was suspended, using the stored current data, in response to the resume command.

Figure 2:
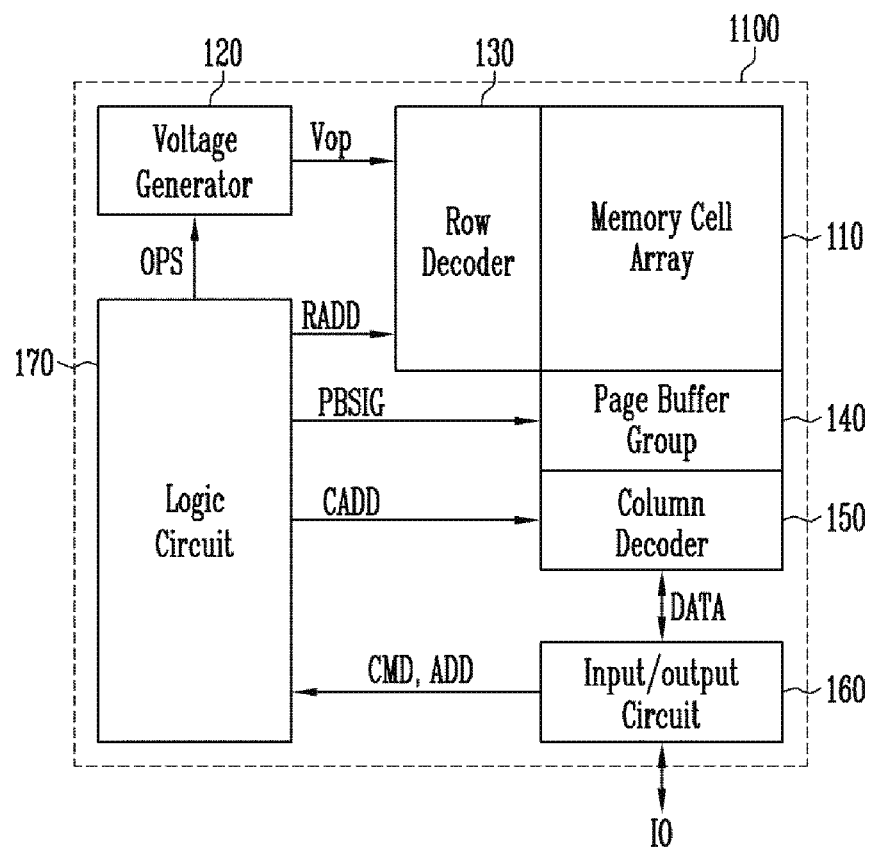
FIG. 2 is a diagram for specifically explaining the memory device of FIG. 1.

FIG. 2 is a diagram for specifically explaining the memory device of FIG. 1.

Referring to FIG. 2, the memory device 1100 may include a memory cell array 110 in which data is stored, peripheral circuits 120 to 160, configured to perform a program operation, a read operation, or an erase operation, and a logic circuit 170 configured to control the peripheral circuits 120 to 160.

The memory cell array 110 may include a plurality of memory blocks. Each of the memory blocks includes a plurality of memory cells, and the memory cells may be implemented in a 2D structure, parallel with the substrate, or a 3D structure in which the memory cells are stacked in a direction perpendicular to the substrate.

The peripheral circuits 120 to 160 may include a voltage generator 120, a row decoder 130, a page buffer group 140, a column decoder 150, and an input/output circuit 160.

The voltage generator 120 may generate and output operating voltages, required for various operations in response to the operation signals OPS. For example, the voltage generator 120 may generate and output a program voltage, a verify voltage, a read voltage, a pass voltage, an erase voltage, and the like.

The row decoder 130 may select a single memory block, among the memory blocks included in the memory cell array 110, based on a row address RADD, and may transfer operating voltages Vop to the selected memory block.

The page buffer group 140 may be coupled to the memory cell array 110 through bit lines. For example, the page buffer group 140 may include page buffers coupled to respective bit lines. The page buffers may simultaneously operate in response to the page buffer control signals PBSIG, and may temporarily store data during a program or read operation. To this end, each of the page buffers may include a plurality of latches to temporarily store data. The number of latches may be set differently, based on the memory cell policy of the memory cell array 110. For example, the number of latches in the memory device, driven based on a triple-level cell (TLC) policy, may be greater than the number of latches in the memory device, driven in a multi-level cell (MLC) policy. The number of latches in the memory device, driven based on a quadruple-level cell (QLC) policy, may be greater than the number of latches in the memory device, driven based on the TLC policy.

With an increase in the number of latches, the size of the page buffer group 140 may increase, which may result in an increase in the size of the memory device 1100. Therefore, when the number of latches is minimized, the size of the memory device 1100 may be minimized as well. In the present embodiment, the memory device 1100 may execute a suspend command and a resume command without increasing the number of latches.

The column decoder 150 may transfer data DATA between the input/output circuit 160 and the page buffer group 140 based on a column address CADD.

The input/output circuit 160 may be coupled to the controller 1200, through the input/output lines JO, and may input/output a command CMD, an address ADD, and data DATA through the input/output lines JO. For example, the command CMD and the address ADD, received from the controller 1200, may be transferred to the logic circuit 170 through the input/output circuit 160, and the data DATA may be transferred to the column decoder 150. Also, the data read from the memory cell array 110, during a read operation, may be output to the controller 1200 through the input/output circuit 160.

The logic circuit 170 may be enabled in response to the control signals received from the controller 1200, or may output operation signals OPS, a row address RADD, page buffer control signals PBSIG, and a column address CADD by identifying the received command CMD and address ADD.

Figure 3:
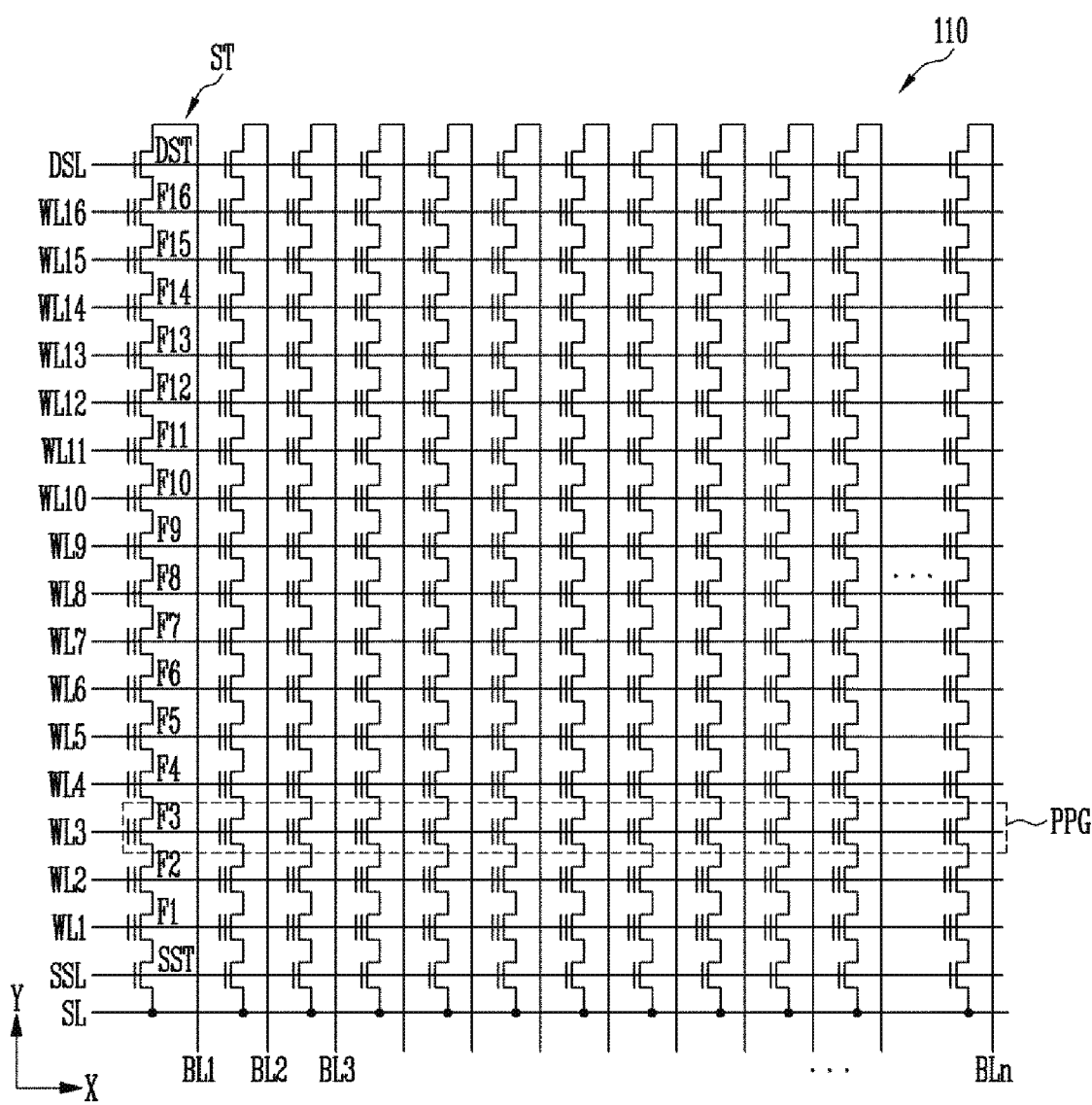
FIG. 3 is a diagram illustrating a memory block.

FIG. 3 is a diagram illustrating a memory block.

Referring to FIG. 3, the memory block 110 may include a first select line, word lines, and a second select line, arranged in parallel. For example, the word lines may be coupled in parallel between the first and second select lines. Here, the first select line may be a source select line SSL, and the second select line may be a drain select line DSL.

In detail, the memory block 110 may include a plurality of strings ST, coupled between bit lines BL1 to BLn and a source line SL. The bit lines BL1 to BLn may be coupled to their respective strings ST, and the source line SL may be coupled to the strings ST. The strings ST may be equally configured, and thus, the string ST, coupled to the first bit line BL1, will be described in detail below.

The string ST may include a source select transistor SST, a plurality of memory cells F1 to F16, and a drain select transistor DST, which are coupled, in series, to each other, between the source line SL and the first bit line BL1. A single string ST may include at least one source select transistor SST and at least one drain select transistor DST. Furthermore, the number of memory cells may vary, depending on the embodiment. In this particular embodiment, the string ST may include 16 memory cells F1 to F16.

A source of the source select transistor SST may be coupled to the source line SL, and a drain of the drain select transistor DST may be coupled to the first bit line BL1. The memory cells F1 to F16 may be coupled, in series, between the source select transistor SST and the drain select transistor DST. All of the gates of the source select transistors SST in the memory block 110, may be coupled, in common, to the source select line SSL, and all of the gates of the drain select transistors DST in the memory block 110 may be coupled, in common, to the drain select line DSL, and all of the gates of the memory cells F1 to F16 in the memory block 110 may be coupled, in common, to a plurality of word lines WL1 to WL16, respectively. A group of memory cells, coupled to the same word line, among the memory cells included in different strings ST, may be referred to as a 'physical page (PPG)'. Therefore, the memory block 110 may include a number of physical pages PPG, identical to the number of word lines WL1 to WL16.

One memory cell may store one bit of data. This cell is typically called a single-level cell (SLC). Here, one physical page (PPG) may store data corresponding to one logical page (LPG). The data corresponding to one logical page (LPG) may include a number of data bits identical to the number of memory cells included in one physical page (PPG). Alternatively, one memory cell may store two or more bits of data. This cell is called a multi-level cell (MLC). Here, one physical page (PPG) may store data corresponding to two or more logical pages (LPG).

As explained above, a memory cell in which two or more bits of data are stored in one memory cell is called a multi-level cell (MLC). However, recently, as the number of data bits stored in one memory cell increases, the multi-level cell (MLC) refers to a memory cell in which two bits of data are stored, while a memory cell in which three or more bits of data are stored is called a triple-level cell (TLC) and a memory cell in which four or more bits of data are stored is called a quadruple-level cell (QLC). In addition to these examples, a memory cell scheme, in which multiple bits of data are stored, has been developed, and the present embodiment may be applied to a memory system 1000 in which two or more bits of data are stored.

Figure 4:
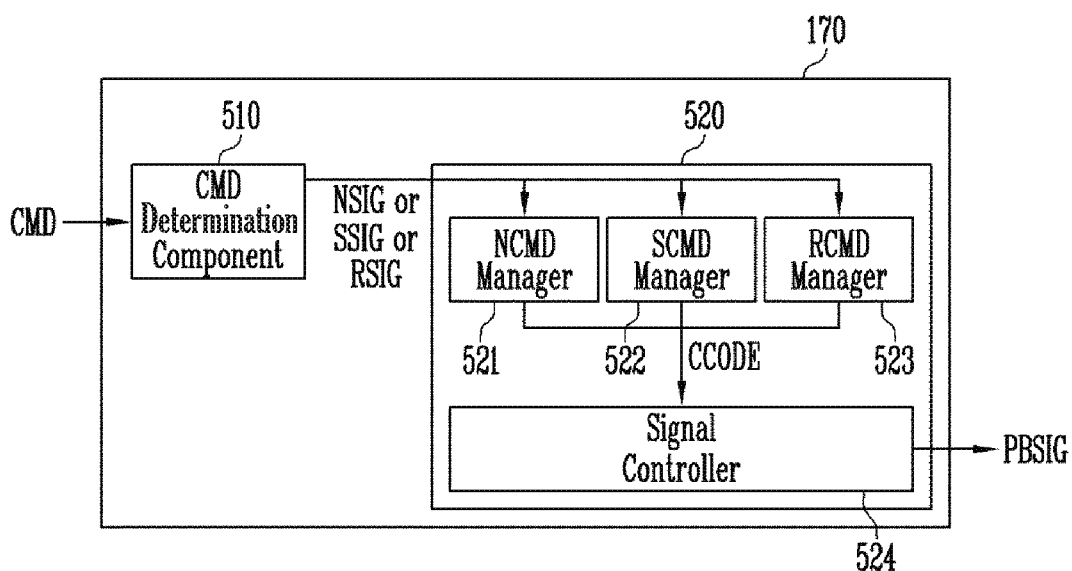
FIG. 4 is a diagram for specifically explaining the configuration of a logic circuit.

FIG. 4 is a diagram for specifically explaining the configuration of a logic circuit.

Referring to FIG. 4, the logic circuit 170 may include a command determination component 510 and a command execution component 520.

The command determination component 510 may determine whether the command CMD, output from the controller 1200, is a normal command NCMD, a suspend command SCMD, or a resume command RCMD, and may output a signal NSIG, SSIG or RSIG, corresponding to the type of command, based on the determination result. For example, the command determination component 510 may output a normal command signal NSIG when the received command CMD is determined to be a normal command NCMD, may output a suspend command signal SSIG when the received command CMD is determined to be a suspend command SCMD, and may output a resume command signal RSIG when the received command CMD is determined to be a resume command RCMD. The normal command NCMD may be a program command or an erase command, the suspend command SCMD may be a read command, and the resume command RCMD may be a command for resuming execution of the command after being suspended based on the suspend command SCMD. Alternatively, the normal command NCMD may be a program command, a read command, or an erase command, corresponding to requests generally output by the host 2000, and the suspend command SCMD may be a read command, corresponding to a suspend read request output by the host 2000.

Various methods may be used when the command determination component 510 determines whether the command CMD is a normal command, a suspend command, or a resume command. For example, when a command CMD is generated in response to a request from the host 2000, the controller 1200 may add a code for identifying a normal, suspend or resume command in the command CMD, and the command determination component 510 may determine the type of command CMD based on the added code. Alternatively, the host 2000 may add a suspend code when it outputs a request, and the controller 1200 may output a command CMD in which the suspend code is included.

The command execution component 520 may include a normal command manager 521, a suspend command manager 522, a resume command manager 523, and a signal controller 524.

The normal command manager 521, the suspend command manager 522, and the resume command manager 523 may receive in common the signal NSIG, SSIG or RSIG output from the command determination component 510, and may be enabled in response to different signals. For example, the normal command manager 521 may be enabled when the normal command signal NSIG is received, and may be disabled when the suspend command signal SSIG or the resume command signal RSIG is received. On the other hand, the suspend command manager 522 may be enabled when the suspend command signal SSIG is received, and may be disabled when the normal command signal NSIG or the resume command signal RSIG is received. Lastly, the resume command manager 523 may be enabled when the resume command signal RSIG is received, and may be disabled when the normal command signal NSIG or the suspend command signal SSIG is received. That is, when one of the normal command manager 521, the suspend command manger 522, and the resume command manager 523 is enabled, the other two managers are disabled.

The normal command manager 521 may output a control code CCODE for executing a normal operation in response to the normal command signal NSIG, to execute a suspend operation in response to the suspend command signal SSIG, and to execute a resume operation in response to the resume command signal RSIG.

The signal controller 524 may output page buffer control signals PBSIG in response to the control code CCODE, output from the normal command manager 521, the suspend command manager 522, or the resume command manager 523. The signal controller 524 may output page buffer control signals PBSIG to control the page buffers, in response to the control code CCODE.

The page buffers may be identically configured, and may operate in the same manner in response to the page buffer control signals PBSIG. However, because the pieces of data included in the respective page buffers may be different, the pieces of data, to be stored in the page buffers, may be different from each other.

Although not illustrated in FIG. 4, the logic circuit 170 may further include devices for outputting operation signals (OPS in FIG. 2), a row address (RADD in FIG. 2), and a column address (CADD in FIG. 2), in addition to the above-mentioned components. These components are commonly used devices, and thus a detailed description thereof will be omitted.

Figure 5:
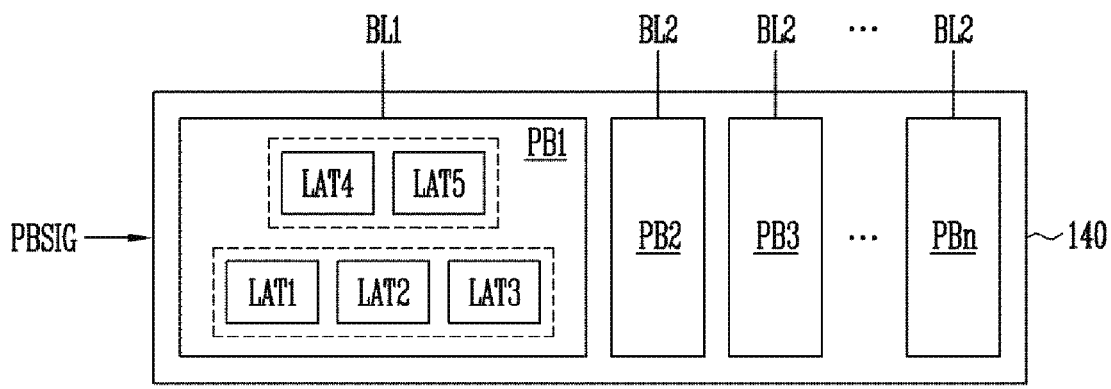
FIG. 5 is a diagram for schematically explaining the configuration of a page buffer.

FIG. 5 is a diagram for schematically explaining the configuration of a page buffer.

Referring to FIG. 5, first to n-th page buffers PB1 to PBn, included in the page buffer group 140, may be identically configured. The first to n-th page buffers PB1 to PBn may be coupled to first to n-th bit lines BL1 to BLn, respectively.

For example, describing the first page buffer PB1, the first page buffer PB1 may include a plurality of latches LAT1 to LAT5 to temporarily store data. The number of latches LAT1 to LAT5 may be set differently based on the number of bits stored in a memory cell and based on the method of performing the verify operation. The present embodiment is described based on a triple-level cell (TLC), which is configured such that three bits are able to be stored in a single memory cell. However, the present invention is not limited thereto.

Because a triple-level cell (TLC) is configured such that three pieces of logical page data are stored in a single memory cell, at least three latches are required for a program operation, and at least one latch is required for a verify operation, which is performed during the program operation, or a read operation. That is, at least four latches are needed in order to perform a program operation, and at least one latch is needed in order to perform a read operation.

Currently, a verify operation may be performed twice in certain program loops in order to improve the retention characteristic of memory cells when a program operation is performed. For example, when the threshold voltage of memory cells approaches a target level, the memory device 1100 adjusts the voltage applied to bit lines, thereby adjusting the speed at which the threshold voltage of the memory cells increases. As described above, at least two latches may be used in order to store the data sensed during the two verify operations.

That is, the first page buffer PB1 may include at least four latches LAT1 to LAT4, or may include at least five latches LAT1 to LAT5 in order to improve the reliability of a verify operation.

In the following embodiment, a description will be made based on the first to n-th page buffers PB1 to PBn, each of which including at least five latches LAT1 to LAT5. For example, each of the first to n-th page buffers PB1 to PBn may include first to five latches LAT1 to LAT5, the first to third latches LAT1, LAT2, and LAT3 storing original data during a program operation and the fourth and fifth latches LAT4 and LAT5 storing sensing data during a verify operation or storing read data during a read operation.

Each of the first to n-th page buffers PB1 to PBn may control the first to fifth latches LAT1 to LAT5 in response to the page buffer control signals PBSIG. That is, each of the first to n-th page buffers PB1 to PBn may transfer data between the first to fifth latches LAT1 to LAT5. For example, in response to the page buffer control signals PBSIG, each of the first to n-th page buffers PB1 to PBn may adjust the voltage or current, applied to a bit line, during a program operation, may temporarily store the data, sensed during a verify operation, and output the same, and may temporarily store the data, read during a read operation, and output the same.

With the progress of a verify operation when a program operation is performed, the data, stored in the fourth latch LAT4 or the data stored in the fourth and fifth latches LAT4 and LAT5, may be changed. In the present embodiment, the current data is stored by combining the changed data with the original data, stored in the first to third latches LAT1, LAT2, and LAT3, and the normal operation may continue using the stored current data when a resume operation is performed after a suspend operation.

A method of operating a memory device will be described below with reference to the configuration of the page buffer illustrated in FIG. 5.

Figure 6:
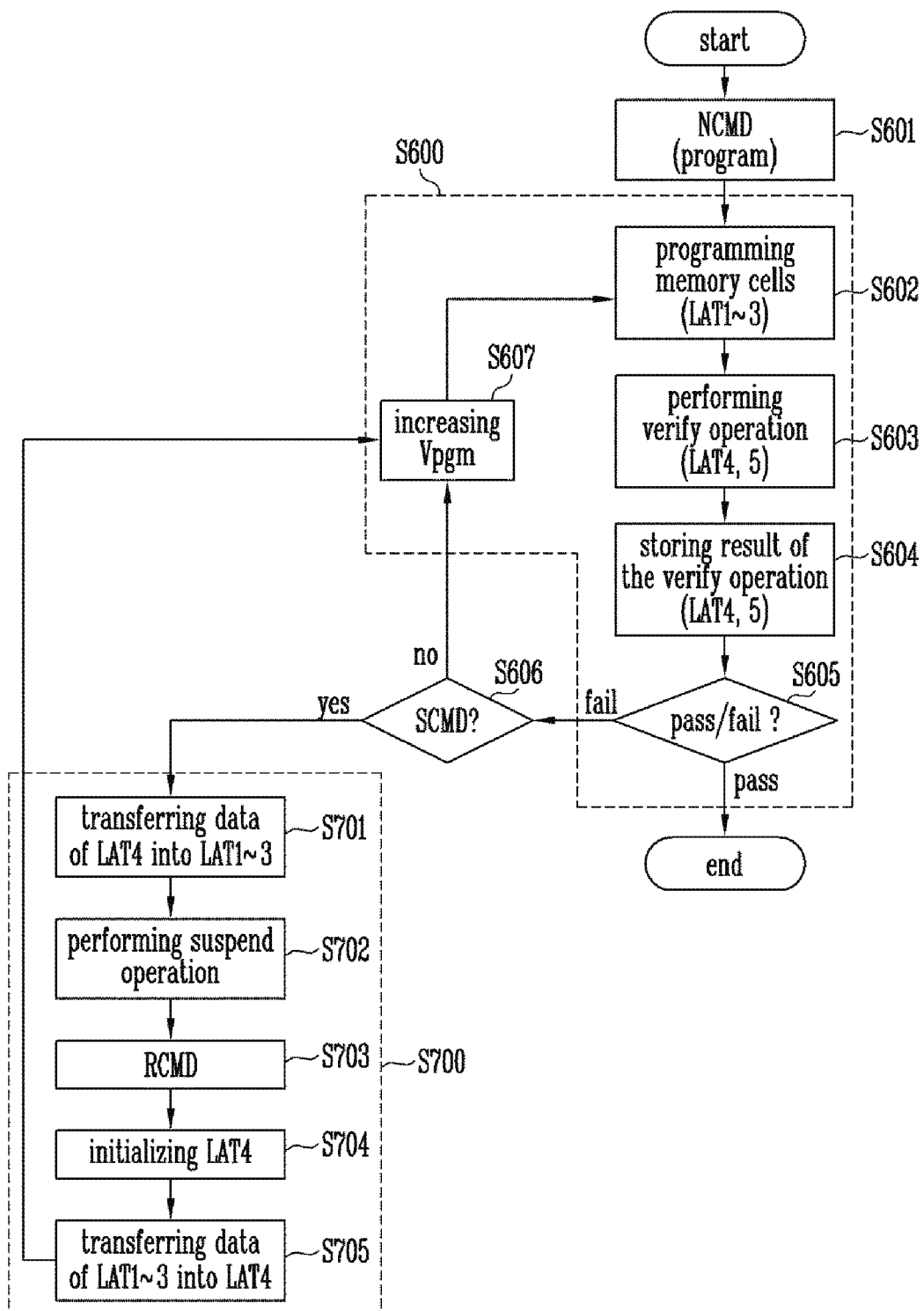
FIG. 6 is a flowchart, illustrating a method of operating a memory device, according to an embodiment of the present disclosure.

FIG. 6 is a flowchart, illustrating the method of operating a memory device, according to an embodiment of the present disclosure.

Referring to FIG. 6, the memory device (1100 in FIG. 2) may perform a normal operation S600 in response to a normal command NCMD at step S601, and may suspend the normal operation S600 and perform a suspend operation S700, corresponding to a suspend command SCMD, when the suspend command SCMD is input at step S606, while the normal operation S600 is being performed.

Specifically, when a normal command NCMD is received from the controller 1200, the memory device 1100 may perform a setup operation to perform a normal operation, corresponding to the normal command NCMD at step S601. Here, the normal command NCMD may be a command for a normal program operation. For example, when the memory device 1100 receives a normal command NCMD, the normal command manager (521 in FIG. 2), included in the logic circuit (170 in FIG. 2), is enabled, and the setup operation required for the normal operation is performed.

When the setup operation, required for the normal operation, is completed at step S601, the memory device 1100 performs the normal program operation S600. The normal program operation S600 may be performed through an Incremental Step Pulse Program (ISPP) method, in which a program voltage gradually increases. For example, a program operation based on ISPP may include the operation of increasing the threshold voltage of memory cells, by applying a program voltage to a selected word line, and a verify operation to determine whether the threshold voltage of the memory cells reaches a target level. The section of time between the first application of the program voltage to a selected word line and right before the application of the next program voltage to the selected word line is referred to as a program loop. That is, a program loop may include the operation of applying a program voltage to a selected word line and at least one verify operation. The embodiment illustrated in FIG. 6 describes an example in which a program operation is configured such that a verify operation is performed once in a program loop.

When a normal program operation begins, the memory device 1100 may program memory cells at step S602 by applying a program voltage Vpgm to a selected word line. Specifically, three pieces of logical page data, received from the controller 1200, may be input to different latches LAT1, LAT2, and LAT3, included in each of the page buffers. For example, Most Significant Bit (MSB) data may be input to the first latch LAT1, Central Significant Bit (CSB) data may be input to the second latch LAT2, and Least Significant Bit (LSB) data may be input to the third latch LAT3. That is, the MSB, CSB and LSB data input to the first to third latches LAT1, LAT2, and LAT3 for the first time may be the original data. The memory device 1100 may program the memory cells using the original data, input to the first to third latches LAT1, LAT2, and LAT3 of each of the page buffers.

Because the program operation may be performed based on ISPP, a verify operation may be performed at step S603 after step S602. The verify operation may be performed using the fourth and fifth latches LAT4 and LAT5. That is, the original data is maintained in the first to third latches LAT1, LAT2, and LAT3, and the verify operation may be performed using the fourth and fifth latches LAT4 and LAT5. The verify operation for the memory cells, to which the program voltage is applied, may be performed twice. In order to perform the verify operation, the data stored in the first to third latches LAT1, LAT2, and LAT3 is transferred to the fourth and fifth latches LAT4 and LAT5.

The data sensed during the first verify operation may be stored in the fourth latch LAT4 and the data sensed during the second verify operation may be stored in the fifth latch LAT5 at step S604. For example, the data in the fourth and fifth latches LAT4 and LAT5 is changed when the fourth and fifth latches LAT4 and LAT5 correspond to the memory cells that pass the verify operation, among the memory cells to be programmed. However, the data in the fourth and fifth latches LAT4 and LAT5 is maintained to be the same as the data stored at the time of starting the verify operation when the fourth and fifth latches LAT4 and LAT5 correspond to the memory cells that are not to be programmed or correspond the memory cells that fail the verify operation.

The memory device 1100 may determine at step S605 whether the verify operation has passed or failed based on the data stored in the fourth and fifth latches LAT4 and LAT5. For example, the verify operation may pass in the page buffers that store the data of the memory cells, of which the threshold voltage reaches a target level, but may fail in the page buffers, of which the threshold voltage is lower than the target level.

When the verify operation for all of the memory cells, included in the selected page, has passed, the normal program operation S600 may be terminated. However, the program operation may continue when at least one of the memory cells fails the verify operation. Therefore, even though the verify operation for the selected page fails, the selected page may include memory cells that passed the verify operation. The data of the fourth and fifth latches LAT4 and LAT5, which is changed because the verify operation has passed, may be maintained until the verify operation for the selected page passes.

When the verify operation for the selected page fails, the memory device 1100 may determine at step S606 whether a suspend command SCMD has been input. The suspend command SCMD may be input anytime when the normal program operation S600 is being performed. For example, when a suspend command SCMD is received by the memory device 1100 while the normal program operation S600 is being performed, the suspend command SCMD may be input to the logic circuit 170. When the current program loop is terminated, the logic circuit 170 may determine whether the suspend command SCMD is input. When it is determined that a suspend command SCMD has not been input, the logic circuit 170 may increase the program voltage Vpgm at step S607 and continue the normal program operation S600 for the memory cells. The normal program operation S600 may be repeatedly performed until the verify operation for the selected page passes at step S605.

When the suspend command SCMD is input, the memory device 1100 may perform a suspend operation S700.

The suspend operation S700 may include transferring the current data, stored in the fourth latch LAT4, to the first to third latches LAT1, LAT2, and LAT3, in which the original data is stored, at step S701, performing an operation, corresponding to the suspend command at step S702, and initializing the fourth latch LAT4 at step S704 in response to a resume command at step S703, and may include restoring verification data to the fourth latch LAT4 at step S705, using the data stored in the first to third latches LAT1, LAT2, and LAT3, when the suspend operation is terminated.

During the suspend operation S700, the data in the first to third latches LAT1, LAT2, and LAT3, which is changed by the passed verify operation, is overwritten. However, the overwritten data is data, pertaining to the memory cells that already passed the verify operation, and the original data of the memory cells, that passed the verify operation, is not required for the following program operation S600. Therefore, when the suspend operation S700 is performed, even though the data corresponding to the memory cells that passed the verify operation is changed in the page buffers, the following program operation for the remaining memory cells may be performed normally.

FIG. 6 describes an embodiment in which the data, stored in the fourth latch LAT4, is transferred to the first to third latches LAT1, LAT2, and LAT3 when the suspend operation S700 is performed. However, when it is impossible to directly transfer the data from the fourth latch LAT4 to the first to third latches LAT1, LAT2, and LAT3, due to the configuration of a circuit, the data stored in the fourth latch LAT4 may be transferred to the fifth latch LAT5, and then the data stored in the fifth latch LAT5 may be transferred to the first to third latches LAT1, LAT2, and LAT3. With regard to this, an embodiment will be described below.

Figure 7:
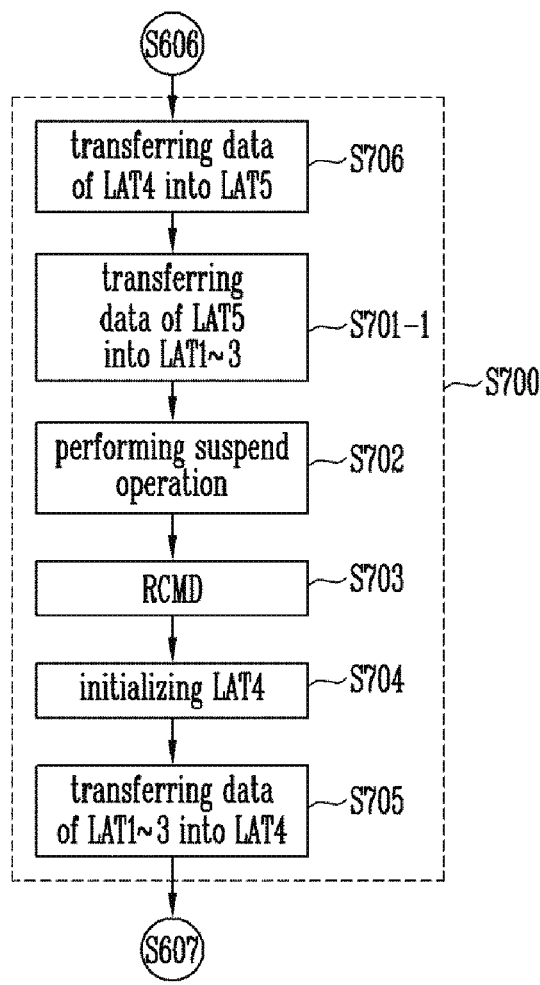
FIG. 7 is a flowchart, illustrating a method of operating a memory device, according to an embodiment of the present disclosure.

FIG. 7 is a flowchart, illustrating a method of operating a memory device, according to an embodiment of the present disclosure.

Referring to FIG. 7, the remaining operations, excluding the suspend operation S700, are the same as the operations described with reference to FIG. 6. In an embodiment, illustrated in FIG. 7, when the suspend operation S700 is performed, the memory device 1100 transfers data from the fourth latch LAT4 to the fifth latch LAT5 at step S706 and may then transfer the data from the fifth latch LAT5 to the first to third latches LAT1, LAT2, and LAT3 at step S701-1. When the data is transferred from the fourth latch LAT4 to the fifth latch LAT5, the sensing node of the page buffer may be used.

The remaining operations S702 to S705 are the same as those in the embodiment described with reference to FIG. 6.

Among the above-described embodiments, the embodiment of FIG. 6 is configured such that data can be directly transferred from the fourth latch LAT4 to the first to third latches LAT1, LAT2, and LAT3. Therefore, the embodiment of FIG. 7 will be described in detail below.

FIGS. 8 to 13 are diagrams for specifically illustrating a method for transferring data in a page buffer according to the operating method of the present disclosure.

Figure 8:
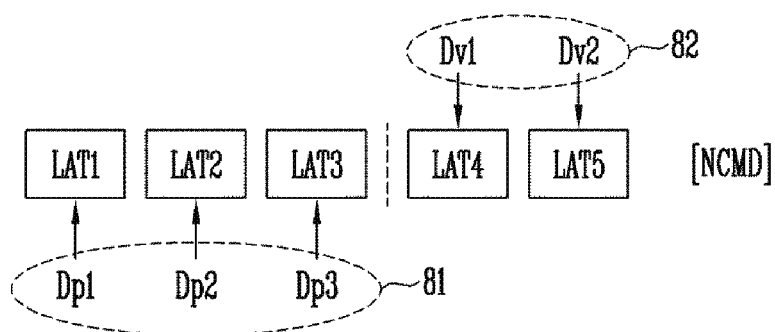
FIGS. 8 to 13 are diagrams, specifically illustrating a method for transferring data in a page buffer based on an operating method, according to the present disclosure.

Referring to FIG. 8, when a normal command NCMD is input to the memory device 1100, the normal command manager (521 in FIG. 4) may output a control code CCODE to execute a normal operation. Then, the signal controller 524 outputs a page buffer control signals PBSIG based on the control code CCODE, thereby controlling the page buffers in the following manner.

For the normal program operation, original data 81, received from the controller 1200, may be input to the first to third latches LAT1, LAT2, and LAT3. Because three pieces of logical page data are used in a triple-level cell (TLC), the original data 81 may include first to third pieces of data Dp1 to Dp3. For example, the first piece of data Dp1 may be MSB data, the second piece of data Dp2 may be CSM data, and the third piece of data Dp3 may be LSB data. The order and the location in which the first to third pieces of data Dp1 to Dp3 are input to the first to third latches LAT1, LAT2, and LAT3 may be different based on the memory device 1100. Furthermore, two latches may be used in a multi-level cell (MLC), and four latches may be used in a quadruple-level cell (QLC). The present embodiment is described based on a TLC, but may also be applied in an MLC or a QLC. Additionally, the present embodiment may be applied when four or more bits of data are stored in a single cell.

The program operation may be performed using the data stored in the first to third latches LAT1, LAT2, and LAT3, and verification data 82, that is sensed during a verify operation, may be stored in the fourth and fifth latches LAT4 and LAT5. For example, the verify operation may be performed twice in a row for the same program voltage, and the first verification data Dv1, that is sensed during the first verify operation, may be stored in the fourth latch LAT4, and the second verification data Dv2, that is sensed during the second verify operation, may be stored in the fifth latch LAT5.

Whether a verify operation has passed or failed may be determined based on the data input to the fourth and fifth latches LAT4 and LAT5. For example, the verification data 82 input to the fourth and fifth latches LAT4 and LAT5 may change when the verify operation has passed, but may be maintained when the verify operation has failed.

Because a plurality of memory cells are included in the selected page, the number of memory cells that pass the verify operation increases as the number of program loops increase. That is, before the verify operations for all of the memory cells, included in the selected page, pass, the verification data 82 may continuously change.

Figure 9:
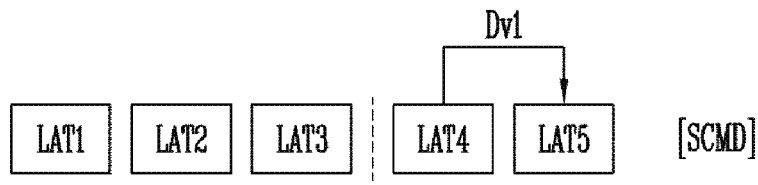

Referring to FIG. 9, when a suspend command SCMD is input to the memory device 1100, while the program operation for the selected page is being performed, the suspend command manager (522 of FIG. 4) may output a control code CCODE for executing a suspend operation, and the signal controller 524 may output a page buffer control signals PBSIG based on the control code CCODE, thereby controlling page buffers in the following manner.

When the suspend command SCMD is input to the memory device 1100, the program operation, that is being performed, is suspended, and the first verification data Dv1, currently stored in the fourth latch LAT4, may be transferred to the fifth latch LAT5. The first verification data Dv1 may vary based on whether the verify operation has passed or failed. That is, the first verification data Dv1, stored in each of the fourth latches LAT4, included in different page buffers, may be different.

Figure 10:
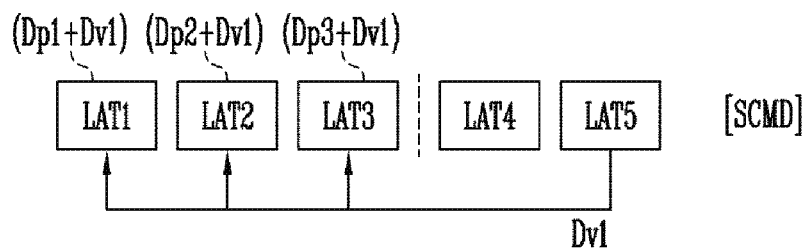

Referring to FIG. 10, the first verification data Dv1, stored in the fifth latch LAT5, may be transferred to the first to third latches LAT1, LAT2, and LAT3. However, based on the first verification data Dv1, the data stored in each of the first to third latches LAT1, LAT2, and LAT3 may be maintained without change, or may be changed to the first verification data Dv1. For example, the pieces of data, stored in some of the first to third latches LAT1, LAT2, and LAT3, may be changed to the first verification data Dv1 in the page buffer that passes the verify operation, but the data, stored in the first to third latches LAT1, LAT2, and LAT3, may be maintained, regardless of the first verification data Dv1 in the page buffer that fails the verify operation.

Figure 11:
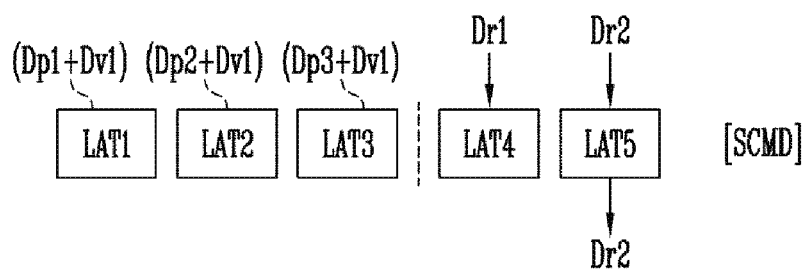

Referring to FIG. 11, because the first verification data Dv1 is reflected in the first to third latches LAT1, LAT2, and LAT3 based on the verification result, the fourth and fifth latches LAT4 and LAT5 may be used for the operation corresponding to the suspend command SCMD. When the suspend command SCMD is a read operation, all of the fourth and fifth latches LAT4 and LAT5 may be used for the read operation, or only the fourth latch LAT4 may be used therefor. When all of the fourth and fifth latches LAT4 and LAT5 are used for the read operation, a sensing operation may be performed twice using the same read voltage during the read operation, just as the first and second verify operations are performed during a program operation. For example, the first read data Dr1, that is sensed by the first read operation, may be stored in the fourth latch LAT4, and the second read data Dr2, that is sensed by the second read operation, may be stored in the fifth latch LAT5. Among the pieces of read data, the second read data Dr2, stored in the fifth latch LAT5, may be output to the controller 1200.

Figure 12:
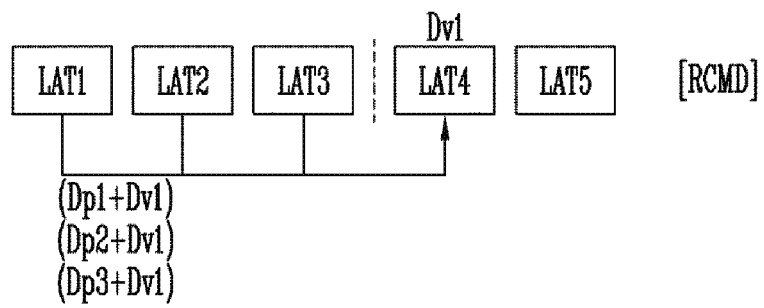

Referring to FIG. 12, when the suspend operation is terminated, the controller 1200 may output a resume command RCMD to the memory device 1100. The memory device 1100 may transfer the data stored in the first to third latches LAT1, LAT2, and LAT3 back to the fourth latch LAT4 in response to the resume command RCMD. In other words, the first verification data Dv1, that was stored in the fourth latch LAT4, when the normal operation was suspended may be again input to the fourth latch LAT4.

Figure 13:
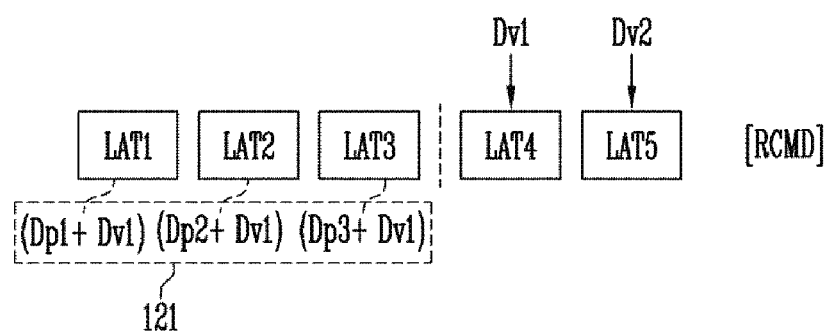

Referring to FIG. 13, because the first verification data Dv1 is again input to the fourth latch LAT4, the normal program operation may be resumed from where it was suspended. For example, because the program operation and the verify operation are performed again, the first verification data Dv1 may be newly input to the fourth latch LAT4 and the second verification data Dv2 may be input to the fifth latch LAT5.

Before the suspend operation is performed, the pieces of original data Dp1 to Dp3 for the normal program operation were stored in the first to third latches LAT1, LAT2, and LAT3. However, even though the pieces of original data Dp1 to Dp3 are changed as the result of the verify operation, since the program operation is not performed for the memory cell that passed the verify operation when the resume operation is performed, the program operation may continue.

The specific embodiment of the page buffer, in which the above-mentioned data transfer operation is performed, will be described below.

Figure 14:
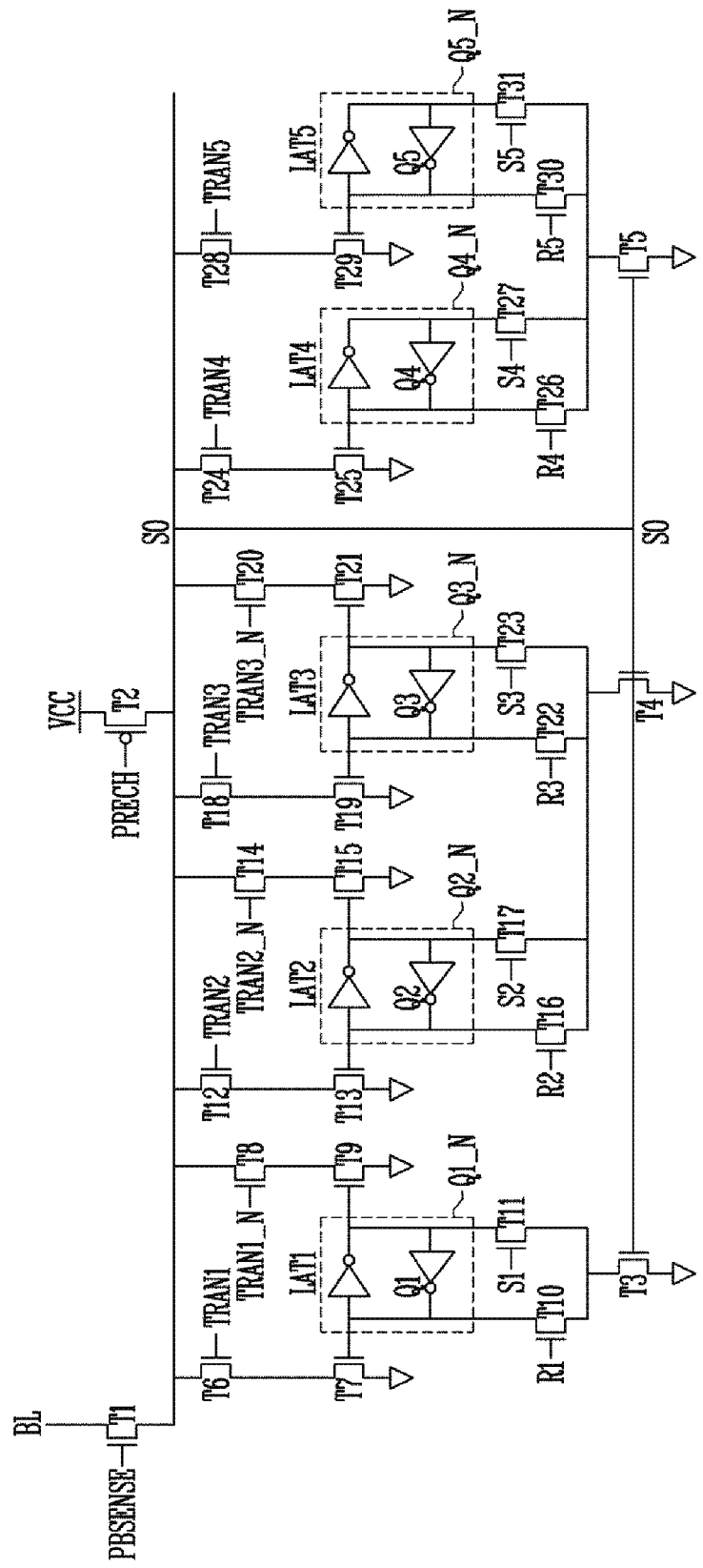
FIG. 14 is a circuit diagram for specifically explaining the configuration of a page buffer according to an embodiment of the present disclosure.

FIG. 14 is a circuit diagram for specifically describing the configuration of a page buffer, according to an embodiment of the present disclosure.

Referring to FIG. 14, a page buffer may include first to fifth latches LAT1 to LAT5 and a plurality of switching transistors configured to transfer data between the first to fifth latches LAT1 to LAT5. Each of the first to fifth latches LAT1 to LAT5 may include two inverters, each having input and output terminals coupled to the output and input terminals of one another. Accordingly, each of the first to fifth latches LAT1 to LAT5 may include two nodes that store two pieces of data that are opposite to each other.

The page buffer, included in the memory device 1100, may further include components for performing various operations, such as a data sensing operation, a caching operation, and the like, in addition to the components, illustrated in FIG. 14. However, the components that are not directly related to the present embodiment have been omitted. Therefore, those skilled in the art may understand that the page buffer is not limited to the circuit illustrated in FIG. 14.

The page buffer includes a sensing node SO, and may transfer data through the sensing node SO. The page buffer may include a first switch T1 configured to couple or decouple a bit line BL to or from the sensing node SO based on a sensing signal PBSENSE. The first switch T1 may be implemented as an NMOS transistor. The page buffer may include a second switch T2 configured to transfer a power voltage VCC to the sensing node SO in response to a precharge signal PRECH. The second switch T2 may be implemented as a PMOS transistor.

The page buffer may include third to fifth switches T3 to T5 configured to form a discharge path by forming a coupling to ground based on the voltage of the sensing node SO. The third switch T3 may be coupled to the region of the first latch LAT1, the fourth switch T4 may be coupled to the region of the second and third latches LAT2 and LAT3, and the fifth switch T5 may be coupled to the region of the fourth and fifth latches LAT4 and LAT5. The third to fifth switches T3 to T5 may be implemented as NMOS transistors.

The page buffer may include sixth to 31st switches T6 to T31, configured to reset or set up the first to fifth latches LAT1 to LAT5 or to transfer data.

The sixth switch T6 may be implemented as an NMOS transistor, configured to couple or decouple the sensing node SO to or from the seventh switch T7, in response to a first transfer signal TRAN1. The seventh switch T7 may be implemented as an NMOS transistor, configured to couple or decouple the sixth switch T6 to or from a ground terminal, based on the data of the first node Q1 of the first latch LAT1. The eighth switch T8 may be implemented as an NMOS transistor, configured to couple or decouple the sensing node SO to or from the ninth switch T9, in response to a first inversion transfer signal TRAN1_N. The ninth switch T9 may be implemented as an NMOS transistor, configured to couple or decouple the eighth switch T8 to or from the ground terminal, based on the data of the first inversion node Q1_N of the first latch LAT1. The tenth switch T10 may be implemented as an NMOS transistor, configured to reset the first node Q1 to '0', in response to a first reset signal R1, and the 11th switch T11 may be implemented as an NMOS transistor, configured to set the first inversion node Q1_N to '0', in response to a first setup signal S1. The tenth and eleventh switches T10 and T11 may be coupled, in parallel, with each other between the first latch LAT1 and the third switch T3.

The 12th switch T12 may be implemented as an NMOS transistor, configured to couple or decouple the sensing node SO to or from the 13th switch T13, in response to a second transfer signal TRAN2. The 13th switch T13 may be implemented as an NMOS transistor, configured to couple or decouple the 12th switch T12 to or from the ground terminal, based on the data of the second node Q2 of the second latch LAT2. The 14th switch T14 may be implemented as an NMOS transistor, configured to couple or decouple the sensing node SO to or from the 15th switch T15, in response to a second inversion transfer signal TRAN2_N. The 15th switch T15 may be implemented as an NMOS transistor, configured to couple or decouple the 14th switch T14 to or from the ground terminal, based on the data of the second inversion node Q2_N of the second latch LAT2. The 16th switch T16 may be implemented as an NMOS transistor, configured to reset the second node Q2 to '0', in response to a second reset signal R2, and the 17th switch T17 may be implemented as an NMOS transistor, configured to set the second inversion node Q2_N to '0', in response to a second setup signal S2. The 16th and 17th switches T16 and T17 may be coupled, in parallel, with each other between the second latch LAT2 and the fourth switch T4.

The 18th switch T18 may be implemented as an NMOS transistor, configured to couple or decouple the sensing node SO to or from the 19th switch T19, in response to a third transfer signal TRAN3. The 19th switch T19 may be implemented as an NMOS transistor, configured to couple or decouple the 18th switch T18 to or from the ground terminal, based on the data of the third node Q3 of the third latch LAT3. The 20th switch T20 may be implemented as an NMOS transistor, configured to couple or decouple the sensing node SO to or from the 21st switch T21, in response to a third inversion transfer signal TRAN3_N. The 21st switch T21 may be implemented as an NMOS transistor, configured to couple or decouple the 20th switch T20 to or from the ground terminal, based on the data of the third inversion node Q3_N of the third latch LAT3. The 22nd switch T22 may be implemented as an NMOS transistor, configured to reset the third node Q3 to '0', in response to a third reset signal R3, and the 23rd switch T23 may be implemented as an NMOS transistor, configured to set the third inversion node Q3_N to '0', in response to a third setup signal S3. The 22nd and 23rd switches T22 and T23 may be coupled, in parallel, with each other between the third latch LAT3 and the fourth switch T4.

The 24th switch T24 may be implemented as an NMOS transistor, configured to couple or decouple the sensing node SO to or from the 25th switch T25, in response to a fourth transfer signal TRAN4. The 25th switch T25 may be implemented as an NMOS transistor, configured to couple or decouple the 24th switch T24 to or from the ground terminal, based on the data of the fourth node Q4 of the fourth latch LAT4. The 26th switch T26 may be implemented as an NMOS transistor, configured to reset the fourth node Q4 to '0', in response to a fourth reset signal R4, and the 27th switch T27 may be implemented as an NMOS transistor, configured to set a fourth inversion node Q4_N to '0', in response to a fourth setup signal S4. The 26th and 27th switches T26 and T27 may be coupled, in parallel, with each other between the fourth latch LAT4 and the fifth switch T5.

The 28th switch T28 may be implemented as an NMOS transistor, configured to couple or decouple the sensing node SO to or from the 29th switch T29, in response to a fifth transfer signal TRAN5. The 29th switch T29 may be implemented as an NMOS transistor, configured to couple or decouple the 28th switch T28 to or from the ground terminal, based on the data of the fifth node Q5 of the fifth latch LAT5. The 30th switch T30 may be implemented as an NMOS transistor, configured to reset the fifth node Q5 to '0', in response to a fifth reset signal R5, and the 31st switch T31 may be implemented as an NMOS transistor, configured to set a fifth inversion node Q5_N to '0', in response to a fifth setup signal S5. The 30th and 31st switches T30 and T31 may be coupled, in parallel, with each other between the fifth latch LAT5 and the fifth switch T5.

As described above, because the first to third latches LAT1, LAT2, and LAT3 store data that is used for a program operation, the data transfer switches T6 to T9, T12 to T15, and T18 to T21 may be used to transfer the data through various routes. Because the fourth and fifth latches LAT4 and LAT5 store data transferred from a bit line BL during a verify operation or a read operation, many data transfer switches are not required for a normal operation. Therefore, in order to reduce the size of the page buffer, the 24th, 25th, 28th and 29th switches T24, T25, T28 and T29 may be included in the region in which the fourth and fifth latches LAT4 and LAT5 are arranged.

In the present embodiment, a suspend operation may be performed without an increase in the number of latches and without adding a switch in the region in which the fourth and fifth latches LAT4 and LAT5 are arranged.

Figure 15:
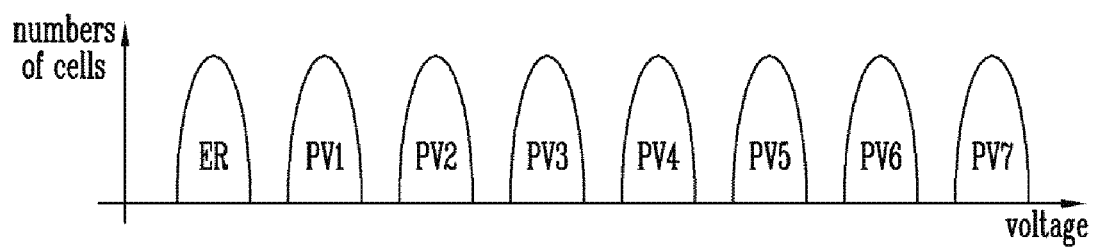
FIG. 15 is a diagram for explaining threshold voltage distributions of memory cells.

FIG. 15 is a diagram for explaining threshold voltage distributions of memory cells.

Referring to FIG. 15, the present embodiment is configured such that memory cells are programmed based on a triple-level cell (TLC). A TLC may have eight different threshold voltage distributions, and the respective threshold voltage distributions may be classified as one erase state ER and seven program states PV1 to PV7. For example, the first program state PV1 may indicate the state in which the threshold voltage is distributed to be higher than in the erase state ER, and the second program state PV2 may indicate the state in which the threshold voltage is distributed to be higher than that in the first program state PV1 and so on. Accordingly, in the seventh program state PV7, the threshold voltage is distributed to be higher than that in the sixth program state PV6.

The erase state ER and the first to seventh program states PV1 to PV7 may be identified based on different gray codes. In the triple-level cell (TLC), the gray code may include LSB data, CSB data, and MSB data. That is, the states of the memory cells may be changed based on a combination of LSB data, CSB data, and MSB data.

Figure 16:
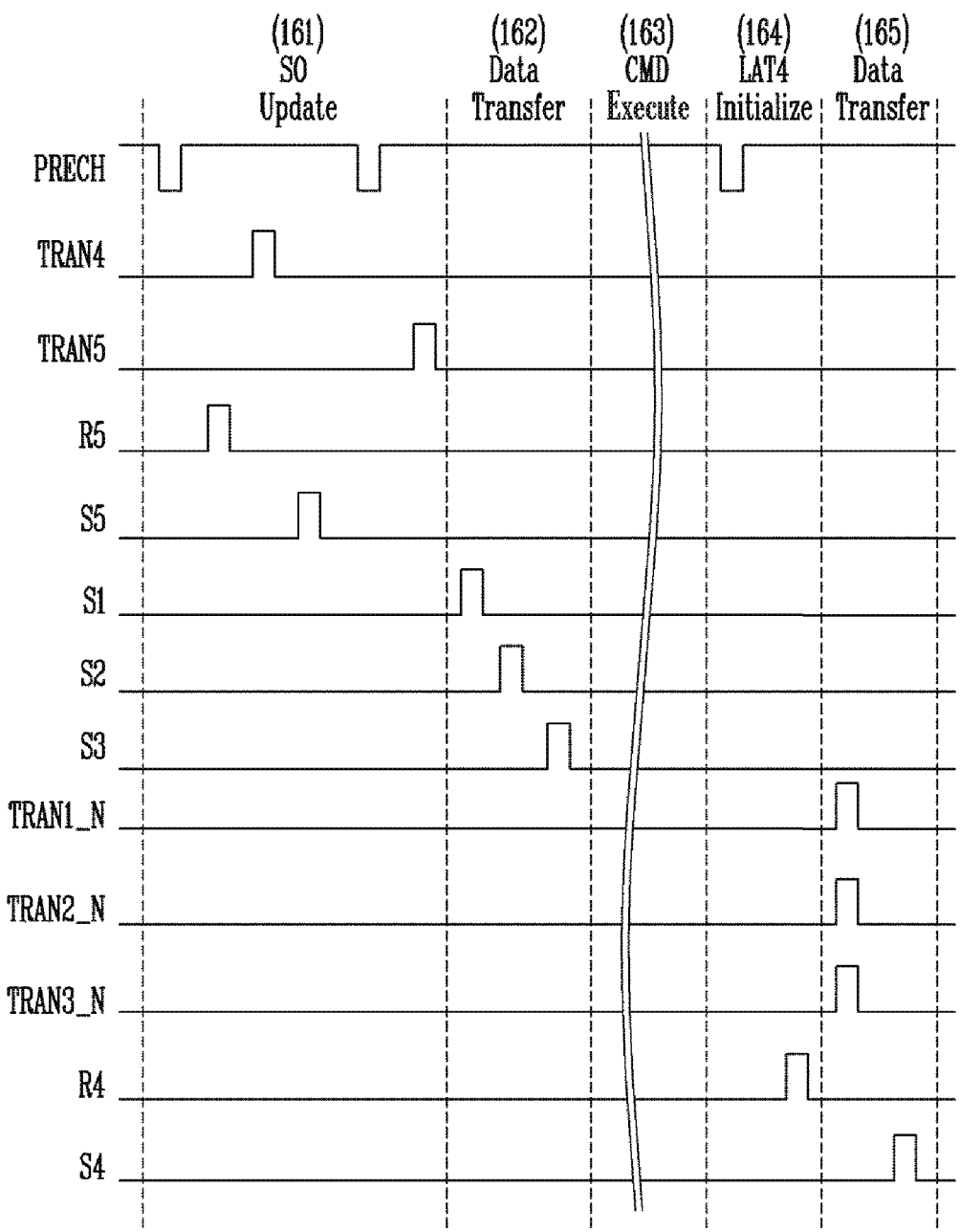
FIG. 16 is a timing diagram for explaining a method of operating the page buffer, illustrated in FIG. 14, according to an embodiment of the present disclosure.

FIG. 16 is a timing diagram for explaining the method of operating the page buffer illustrated in FIG. 14 according to an embodiment of the present disclosure, and FIGS. 17 to 24 are diagrams for specifically explaining a method for transferring data in the page buffer, illustrated in FIG. 14, according to the operating method of the present disclosure.

Referring to FIG. 16, the operation of transferring verification data, stored in the fourth latch LAT4 to the first to third latches LAT1, LAT2, and LAT3, in response to a suspend command, is performed in sections 161 to 162, the operation, corresponding to the suspend command, is performed in section 163, and the operation of restoring the verification data to the fourth latch LAT4 is performed in sections 164 to 165.

Because an operation, corresponding to a normal command, is performed before a suspend command is input, the data stored in the first to fourth latches LAT1 to LAT4, when the normal command NCMD, is executed is described with reference to FIG. 17 before the respective sections in FIG. 16 are described.

Referring to FIG. 17, LSB, CSB, and MSB data of a triple-level cell (TLC) may be stored in the third, second, and first latches LAT3, LAT2, and LAT1, respectively. For example, the MSB, CSB, and LSB data may be '000' in the erase state ER, and data '0' may be stored in each of the first to third inversion nodes Q1_N to Q3_N. In the first program state PV1, the MSB, CSB, and LSB data may be '100', data '1' may be stored in the first inversion node Q1_N, and data '0' may be stored in each of the second and third inversion nodes Q2_N and Q3_N. In the second program state PV2, the MSB, CSB, and LSB data may be '110', and data '1' may be stored in each of the first and second inversion nodes Q1_N and Q2_N, and data '0' may be stored in the third inversion node Q3_N. Similarly, in the seventh program state PV7, the MSB, CSB, and LSB data may be '010', data '0' may be stored in the first inversion node Q1_N, data '1' may be stored in the second inversion node Q2_N, and data '0' may be stored in the third inversion node Q3_N.

While a program operation is being performed in response to the normal command NCMD, the original data, stored in the first to third inversion nodes Q1_N to Q3_N, is not changed. However, the data of the fourth inversion node Q4_N of the fourth latch LAT4, which is used for a verify operation, may be changed based on the result of the verify operation.

For example, the memory cell in the erase state ER is not the cell to be programmed. Therefore, in the page buffer corresponding to the erase state ER, the fourth inversion node Q4_N stores data '0' therein, and data '0' is not changed regardless of the verify operation.

In the page buffers, corresponding to the cells to be programmed, in the program states PV1 to PV7, data '1' is stored in the fourth inversion node Q4_N. When the verify operation fails, data '1' is maintained, but when the verify operation passes, the data may be changed to data '0'. That is, during a program operation, the data stored in the fourth inversion node Q4_N in the page buffers corresponding to the cells to be programmed may be data '1' or '0' based on the result of the verify operation.

Referring again to FIG. 16, when a suspend command SCMD is input while the program operation is being performed as illustrated in FIG. 17, the program operation that is being performed is suspended. FIG. 16 shows the step after the program operation is suspended.

In section 161 in FIG. 16, the data of the sensing node SO may be updated based on the first verification data, stored in the fourth latch LAT4. For example, when the precharge signal PRECH is toggled from a high level to a low level, the power voltage VCC is transferred to the sensing node SO, whereby the data of the sensing node SO becomes '1'. In the present embodiment, when the data of a node is '1', this indicates that the voltage at the node is a high level, and when the data of the node is '0', this indicates that the voltage at the node is a low level.

When data '1' is loaded to the sensing node SO, the third to fifth switches T3 to T5 are turned on. Accordingly, data '0' is loaded to the node between the 30th switch T30 and the fifth switch T5.

Subsequently, the fifth reset signal R5 is toggled to a high level in order to reset the fifth latch LAT5. Accordingly, data '0' is loaded to the fifth node Q5.

Subsequently, the fourth transfer signal TRAN4 is toggled to a high level in order to reflect the data, stored in the fourth latch LAT4, in the sensing node SO. Here, when the data stored in the fourth inversion node Q4_N is '0', data '1' is stored in the fourth node Q4. Accordingly, the 25th switch T25 is turned on, whereby the data of the sensing node SO is changed to '0'. When the data stored in the fourth inversion node Q4_N is '1', the 25th switch T25 is turned off, whereby the data '1' of the sensing node SO is maintained. That is, the data of the sensing node SO may become '0' or '1' based on the data stored in the fourth latch LAT4.

Subsequently, the fifth setup signal S5 is toggled to a high level in order to reflect the data of the sensing node SO in the fifth latch LAT5. For example, when the data of the sensing node SO is '0', the fifth switch T5 is turned off. Accordingly, even though the fifth setup signal S5 is toggled to a high level, the data of the fifth latch LAT5 is maintained. When the data of the sensing node SO is '1', the fifth switch T5 is turned on, whereby the data of the fifth inversion node Q5_N is changed to '0'. Accordingly, the 29th switch T29 is turned on or off based on the data stored in the fifth node Q5.

Subsequently, in order to transfer the data, stored in the fifth latch LAT5, back to the sensing node SO, the precharge signal PRECH is toggled to a low level, whereby data '1' is loaded to the sensing node SO. Also, the fifth transfer signal TRAN5 is toggled to a high level. When the data stored in the fifth inversion node Q5_N is '0', the 29th switch T29 is turned on, whereby the data of the sensing node SO is changed to '0'. When the data, stored in the fifth inversion node Q5_N, is '1', the 29th switch T29 is turned off, whereby the data '1' of the sensing node SO may be maintained.

That is, as illustrated in FIG. 19, data '1' is loaded to the sensing node SO in the page buffer corresponding to the erase state ER, data '0' is loaded to the sensing node SO in the page buffer corresponding to the memory cell that failed the verify operation, among the memory cells to be programmed to any of the first to seventh program states PV1 to PV7, and data '1' is loaded to the sensing node SO in the page buffer corresponding to the memory cell that passed the verify operation.

Subsequently, operations in section 162 of FIG. 16 are performed in order to transfer the data loaded to the sensing node SO to the first to third latches LAT1, LAT2, and LAT3.

In section 162, the first to third setup signals S1 to S3 are sequentially toggled to a high level such that they do not overlap each other. For example, when data '0' is loaded to the sensing node SO, the third and fourth switches T3 and T4 are turned off. Therefore, even though the first to third setup signals S1 to S3 are sequentially toggled to a high level, the data, stored in the first to third latches LAT1, LAT2, and LAT3, is not changed. When data '1' is loaded to the sensing node SO, the third and fourth switches T3 and T4 are turned on. Therefore, when the first to third setup signals S1 to S3 are sequentially toggled to a high level, data is maintained in the latch in which data '0' was stored. However, data is changed to '0' in the latch in which data '1' was stored, among the first to third latches LAT1, LAT2, and LAT3.

That is, referring to FIG. 20, the page buffer, corresponding to the erase state ER, may be configured such that the data of the first to third inversion nodes Q1_N to Q3_N is maintained to be '0' regardless of the result of the verify operation. However, the page buffers corresponding to the first to seventh program states PV1 to PV7 may be configured such that the data of the first to third inversion nodes Q1_N to Q3_N is maintained to be '1' or changed to '0' based on the result of the verify operation, that is, the data loaded to the sensing node SO.

When the sections 161 to 162 in FIG. 16 are finished, the data stored in the first to third latches LAT1, LAT2, and LAT3 are set based on the result of the verify operation, as illustrated in FIG. 20. Accordingly, the data of the fourth and fifth latches LAT4 and LAT5 becomes unnecessary.

Subsequently, a suspend operation corresponding to the suspend command SCMD may be performed in section 163. For example, the suspend command SCMD may be a read operation, and the read operation may be performed using the fourth and fifth latches LAT4 and LAT5. When the read operation is performed, the data stored in the fourth or fifth latch LAT4 or LAT5 is output to the controller 1200. Therefore, when the read operation is completed, the fourth and fifth latches LAT4 and LAT5 may become available.

When the suspend command is finished, a resume operation in sections 164 to 165 may be performed. In order to perform the resume operation, the controller 1200 may output a resume command RCMD to the memory device 1100 when it confirms that the operation for the suspend command CMD is completed.

When the resume command RCMD is received by the memory device 1100, the resume command manager (523 in FIG. 4) may output control code (CCODE in FIG. 4) to perform a resume operation, and the signal controller (524 in FIG. 4) may control the page buffers as described below in response to the control code CCODE.

In section 164, when the resume operation is started, the precharge signal PRECH is toggled to a low level in order to use the fourth latch LAT4 for a verify operation, whereby data '1' is loaded to the sensing node SO. Subsequently, when the fourth reset signal R4 is toggled to a high level, the fifth and 26th switches T5 and T26 are turned on, whereby data '1' may be stored in the fourth inversion node Q4_N.

Figures 21, 22:
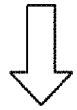

That is, referring to FIG. 21, because the page buffers are simultaneously operated, data '1' may be stored in the respective fourth inversion nodes Q4_N.

Subsequently, the operation of transferring the data stored in the first to third latches LAT1, LAT2, and LAT3 back to the fourth latch LAT4 is performed in section 165. For example, in order to reflect the data stored in the first to third inversion nodes Q1_N to Q3_N to the sensing node SO, the first to third inversion transfer signals TRAN1_N to TRAN3_N may be simultaneously toggled to a high level. Here, if at least one of the first to third inversion nodes Q1_N to Q3_N includes data '1', at least one of the ninth, 15th and 21st switches T9, T15 and T21 is turned on, whereby the data of the sensing node SO is changed to '0'. If all of the first to third inversion nodes Q1_N to Q3_N store '0', the data of the sensing node SO may be maintained to be '1'.

That is, referring to FIG. 22, when the data stored in the first to third inversion nodes Q1_N to Q3_N is reflected in the sensing node SO, data '0' is loaded to the sensing node SO in the page buffer that failed the verify operation, and data '1' is loaded to the sensing node SO in the page buffer that passed the verify operation.

Accordingly, based on whether the verify operation has passed or failed, data '0' or '1' is loaded to the sensing node SO, whereby the fifth switch T5 may be turned off or on.

In section 165 in FIG. 16, the fourth setup signal S4 is toggled to a high level in order to transfer the data of the sensing node SO to the fourth latch LAT4. Here, when the data loaded to the sensing node SO is '0', the reset fourth latch LAT4 maintains the reset state. When the data loaded to the sensing node SO is '1', the fifth and 27th switches T5 and T27 are turned on, whereby data '0' may be stored in the fourth inversion node Q4_N.

That is, as illustrated in FIG. 23, the fourth latch LAT4 may store the data that is the same as the data when the program operation was suspended in response to the suspend command SCMD, and the first to third latches LAT1, LAT2, and LAT3 may store the original data or data changed from the original data.

As illustrated in FIG. 23, when the setup operation of the fourth latch LAT4 is terminated, the suspended program operation may be resumed from the suspended step, but an additional operation for checking the data stored in the first to third latches LAT1, LAT2, and LAT3 may be further performed before the program operation is resumed. That is, in section 165 of FIG. 16, because the first to third inversion transfer signals TRAN1_N to TRAN3_N are simultaneously toggled to a high level, the reliability of the data of the sensing node SO may decrease. In order to compensate for the decreased reliability, a masking operation for reflecting the data stored in the first to third latches LAT1, LAT2, and LAT3 in the sensing node SO for each of the first to seventh program states PV1 to PV7 may be further performed.

Referring to FIG. 24, the masking operation may be performed by sequentially reflecting data for each of the first to seventh program states PV1 to PV7 in the sensing node SO after loading data '1' to the sensing node SO. For example, in the case of the first program state PV1, because data '1' or '0' is loaded to the first inversion node Q1_N and data '0' is loaded to the second and third inversion nodes Q2_N and Q3_N, the first transfer signal TRAN1 and the second and third inversion transfer signals TRAN2_N and TRAN3_N may be toggled to a high level. If the page buffer is the page buffer that failed the verify operation, data '1' is loaded to the first inversion node Q1_N, whereby data '0' is loaded to the first node Q1. Accordingly, even though the first transfer signal TRAN1 is changed to an ON level, the data of the sensing node SO is maintained to be '1', and when the fourth setup signal S4 is toggled to a high level, data '0' may be stored in the fourth inversion node Q4_N. If the page buffer is the page buffer that passed the verify operation, data '0' is loaded to the first inversion node Q1_N, whereby data '1' is loaded to the first node Q1. Accordingly, when the first transfer signal TRAN1 is changed to an ON level, a current path passing through the sixth and seventh switches T6 and T7 is formed, whereby the data of the sensing node SO may be changed to '0'. Then, even though the fourth setup signal S4 is toggled to a high level, data '1', which is the reset data, may be stored in the fourth inversion node Q4_N.

The masking operation may be performed in the same manner for each of the second to the seventh program states PV2 to PV7. However, when the masking operation is performed, the first, second or third transfer signal TRAN1, TRAN2 or TRAN3 may be toggled to a high level only in the latch to which data '1' is able to be input, and the first second or third inversion transfer signal TRAN1_N, TRAN2_N or TRAN3_N may be toggled to a high level in the latch to which data '0' is always input regardless of whether the verify operation has passed or failed. For example, in the second program state PV2, because data '1' may be stored in the first or second inversion node Q1_N or Q2_N only in the first and second latches LAT1 and LAT2, the first and second transfer signals TRAN1 and TRAN2 and the third inversion transfer signal TRAN3_N may be toggled to a high level in order to mask the second program state PV2.

The present disclosure enables latches, which are configured to temporarily store verification data, to be used for a suspend read operation when the suspend read operation is performed during the interruption of a program operation, whereby the current state data pertaining to the program operation that was being performed may be stored and the suspend read operation may be performed without an increase in the number of latches included in page buffers.

Also, the suspended program operation may be quickly resumed after the suspend read operation is terminated, whereby an increase in the operation time of a memory device, which is caused by the suspend command, may be prevented.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A memory device, comprising:
   memory cells in which data is stored;
   page buffers coupled to the memory cells through bit lines, the page buffers including first latches configured to temporarily store original data during a program operation and second latches configured to store verification data during a verify operation; and
   a command execution component configured to control the page buffers in response to a normal command signal, a suspend command signal, or a resume command signal,
   wherein the command execution component controls the page buffers to store the original data in the first latches and store the verification data in the second latches in response to the normal command signal, to provide the verification data, stored in the second latches, to the first latches in response to the suspend command signal, and to transfer the verification data from the first latches to the second latches in response to the resume command signal.

2. The memory device according to claim 1, further comprising:
a command determination component configured to output the normal command signal, the suspend command signal, or the resume command signal to the command execution component, based on a type of a command when the command is received,
wherein the command determination component classifies the command as a normal command, a suspend command, or a resume command based on code included in the command and outputs the normal command signal, the suspend command signal, or the resume command signal.

3. The memory device according to claim 1, wherein the command execution component comprises:
a normal command manager configured to be enabled in response to the normal command signal;
a suspend command manager configured to be enabled in response to the suspend command signal;
a resume command manager configured to be enabled in response to the resume command signal; and
a signal controller configured to output page buffer control signals to control the page buffer in response to a control code, output from the normal command manager, the suspend command manager, or the resume command manager.

4. The memory device according to claim 3, wherein:
the normal command manager, the suspend command manager, and the resume command manager receive, in common, the normal command signal, the suspend command signal, or the resume command signal output from the command determination component, and
each of the normal command manager, the suspend command manager, and the resume command manager is enabled when a corresponding signal is received, thereby outputting the control code to control a corresponding operation.

5. The memory device according to claim 3, wherein, based on the control code received from the suspend command manager, the signal controller outputs the page buffer control signals to provide the verification data, which is currently stored in the second latches, to the first latches, to reset the second latches, and to perform a read operation, corresponding to the suspend command, using the reset second latches.

6. The memory device according to claim 3, wherein, based on the control code, received from the resume command manager, the signal controller outputs the page buffer control signals to transfer the verification data stored in the first latches to the second latches and to resume an operation from where the operation was suspended.

7. A memory device, comprising:
a page buffer, including first to third latches, in which original data is stored, during a program operation, for a selected page, and fourth and fifth latches, in which verification data, that varies during a verify operation, is stored,
wherein the page buffer is configured to:

transfer the verification data stored in the fourth latch to the fifth latch when a suspend operation is started;
perform a read operation using the fourth and fifth latches after reconfiguring the original data stored in the first to third latches based on the verification data transferred to the fifth latch;
restore the verification data to the fourth latch using the data stored in the first to third latches when the read operation is finished; and
resume a normal operation, which had been suspended due to the suspend operation, using the verification data restored to the fourth latch.

8. The memory device according to claim 7, wherein the first to fifth latches transfer data to each other through a sensing node.

9. The memory device according to claim 8, wherein the sensing node temporarily stores data '1' or '0', based on the verification data stored in the fourth latch, and the original data, stored in the first to third latches is maintained or changed, based on the temporarily stored data '1' or '0'.

10. The memory device according to claim 8, wherein, before the normal operation is resumed, the page buffer transfers the data stored in the first to third latches to the sensing node and restores the verification data to the fourth latch based on the data loaded to the sensing node.

11. A method of operating a memory device, comprising:
performing a program operation by increasing a threshold voltage of memory cells using original data stored in first latches and by performing a verify operation of the memory cells using second latches;
suspending the program operation when a suspend command is received during the program operation;
transferring verification data, stored in the second latches, to the first latches when the program operation is suspended;
performing a read operation, corresponding to the suspend command, using the second latches;
restoring the verification data to the second latches using the data stored in the first latches when the read operation is completed; and
resuming the suspended program operation using the restored verification data.

12. The method according to claim 11, wherein the verification data, stored in the second latches, is changed based on a result of the verify operation during the program operation.

13. The method according to claim 11, wherein, when the verification data, stored in the second latches, is transferred to the first latches, the original data stored in the first latches is maintained or changed based on the verification data.

14. The method according to claim 11, further comprising:
before performing the read operation, resetting the second latches.

15. The method according to claim 11, wherein, when the suspended program operation is resumed, the program operation is resumed in a state in which the original data, to which the verification data is reflected, is stored in the first latches.

* * * * *